United States Patent [19]
Gast et al.

[11] 4,151,563
[45] Apr. 24, 1979

[54] ARRANGEMENT FOR THE RECORDING OF RASTERED HALF TONE PICTURES TO AVOID STRIPING

[75] Inventors: Uwe Gast, Rammsee; Heinz Taudt, Kiel, both of Fed. Rep. of Germany

[73] Assignee: Dr. Ing. Rudolf Hell GmbH, Fed. Rep. of Germany

[21] Appl. No.: 852,572

[22] Filed: Nov. 17, 1977

[30] Foreign Application Priority Data

Nov. 22, 1976 [DE] Fed. Rep. of Germany ....... 2652991

[51] Int. Cl.² ............................................ H04N 5/84
[52] U.S. Cl. .................................. 358/298; 346/108; 355/52; 358/302
[58] Field of Search ............... 358/298, 302, 212, 240; 346/108; 354/6, 8, 9, 10; 355/52, 47, 48, 49; 350/204

[56] References Cited
U.S. PATENT DOCUMENTS 3,725,574  4/1973  Gast .................................. 346/108 X
4,025,189  5/1977  Pugsley ............................ 358/298 X Primary Examiner—Stuart N. Hecker
Assistant Examiner—Donald McElheny, Jr.
Attorney, Agent, or Firm—Hill, Gross, Simpson, Van Santen, Steadman, Chiara & Simpson

[57] ABSTRACT

An arrangement for the recording of rastered half tone pictures, in which each covering dot is formed in a raster field, with the size of the dot being dependent upon the light directed on different portions of the raster field, by a plurality of individual light beams coordinated in a line and focused on the recording medium by objective lens means, in which an optical element is disposed in the beam path to such objective lens means to refract light in the direction of said line, with such optical element occupying approximately half of the total projection cross section of all of the component light beams, and with the boundary of the projection cross section extending transversely to said line direction of the light beams.

4 Claims, 2 Drawing Figures

ARRANGEMENT FOR THE RECORDING OF RASTERED HALF TONE PICTURES TO AVOID STRIPING

RELATED PATENT

The present invention is an improvement of the invention illustrated and described in U.S. Pat. No. 3,725,574, granted Apr. 3, 1973 entitled "Method and Apparatus for Recording Rastered Continuous-Tone Pictures in Printed Graphics" which is incorporated herein by reference.

BACKGROUND OF THE INVENTION

The invention relates to an arrangement for the recording of rastered half tone pictures in accordance with the above referred to U.S. Pat. No. 3,725,574, in which the exit openings for the emergence of the respective light beams from the recording apparatus are coordinated in a line.

The reference patent illustrates an arrangement for the so-called "Electronic Rastering of Half Tone Picture", by means of which each covering point, i.e. rastered point in the picture reproduction, is composed of a number of recording lines running in a direction parallel to the recording direction. The recording lines are simultaneously exposed upon a recording medium, such as a film, by means of a plurality of beams derived from a laser light source.

The form and size of covering points thus are dependent upon the length of the individual recording lines making up the same, with the lengths of the recording lines being controlled by suitable means such as light modulators and the corresponding recording data whereby the length of the partial beams can be suitably controlled.

The recording data for the respective covering points is stored in a digital store of a raster point computer for each possible tonal value and for various raster angles. During the recording of a covering point, the transformation of the tonal value information of the picture point involved of the pattern is effected in the raster point computer into recording data for the control of the light modulators.

The modulated individual or partial beams may exit from openings in the recording device over photoconductors, for example, to provide an arrangement such as illustrated in FIG. 6 of the reference patent with the exit openings being arranged in a line extending transversely to the recording direction, and reproduced on the film by means of an objective lense.

When the individual or partial beams are turned on, adjoining light points are formed on the film which expose parallel recording lines of a covering point, as a result of the movement of the film in the recording direction. As the light points are arranged from one another at distance for example, as a result of a coating or covering of the individual photoconductors, which can be even irregular as a result of production tolerances, while the center of a recording line is fully exposed by the spaced light points, the border zones are only exposed by stray light, as a result of which an inhomogenous density may be formed in the exposure profile across a covering point, which often is undesirable.

A subsequent tonal value correction of an already recorded rastered half tone picture, more particularly a so-called point or subsequent etching by means of a reducing agent, is carried out in the reproduction technique. It involves a chemical process in which the covering points in the tonal picture or in partial areas are reduced as to their surface area by removing some of the deposited silver. However, in this subsequent treatment, the density in the center of a covering point is simultaneously decreased. With a continuous effect of the reducing agent, the covering points with an inhomogenous exposure profile finally disintegrate into the individual recording lines and the half tone picture loses its copying properties.

Attempts are made in actual practice to avoid such a stripped formation of the covering points by the utilization of overexposures and by utilizing films with a steep graduation (lith-films). However, this achieves only partial success as the effectiveness of such measures are primarily dependent to a great extent upon the exposure and development of the films. Further, it involves processes which normally require much experience and which is considered particularly disadvantageous. In addition, such process contains the further disadvantage that the specified measures for decreasing the stripping structure can be utilized only in certain specific film materials.

SUMMARY OF THE INVENTION

It is therefore among the objects of the invention to eliminate the referred to disadvantages and to provide an arrangement by means of which covering points having a constant exposure density are achieved for all film materials.

These results are achieved in accordance with the invention by the use of an optical element which is disposed in the beam path to the objective lens arrangement, which is operative to refract light in the line direction of the beam exit openings, with such optical element extending approximately across half the projection cross section of the total beam exit openings, and with the boundary line of that portion of the projection cross section subjected to the action of such optical element, extending transversely to the line direction of such beam exit openings.

The optical element advantageously may be an obliquely disposed glass plate, a wedge-shaped prism member, a refractive lens arrangement or a part of a lens arrangement.

BRIEF DESCRIPTION OF THE DRAWINGS

In the drawings wherein like reference characters indicate like or corresponding parts.

DETAILED DESCRIPTION OF THE INVENTION

Figure 1:
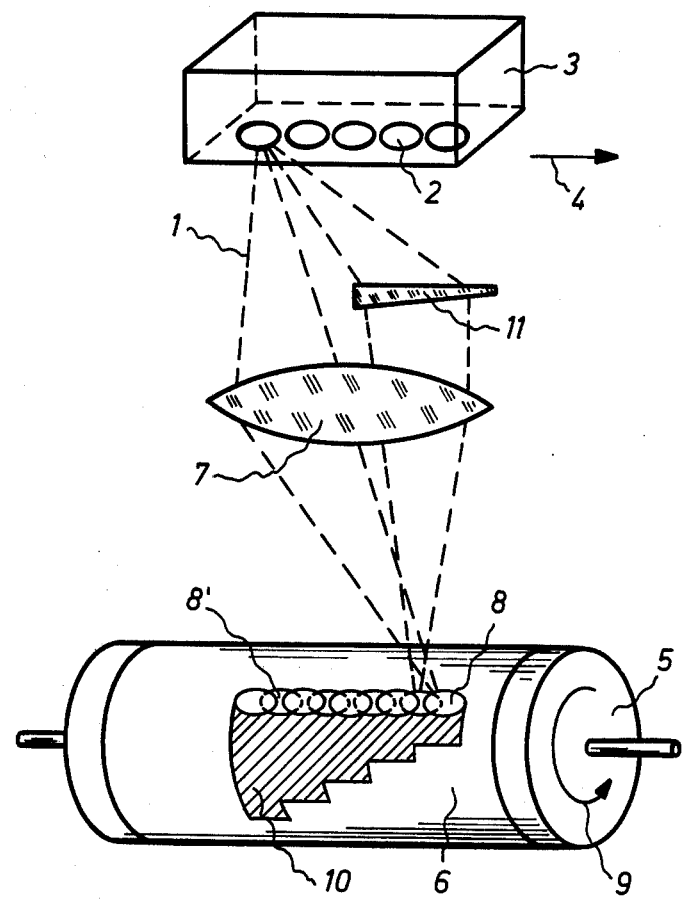
FIG. 1 illustrates the beam path of the respective recording beams.

Referring to FIG. 1, the recording beams 1 emerging from the respective exit openings 2 of a recording device 3 are semischematically illustrated, with a typical beam path being illustrated in broken lines. The respective beam exit openings 2 are illustrated as extending in the direction of the arrow 4. In accordance with the reference patent, the respective recording beams 1 can be polarized, laser beams derived from a main laser beam by beam division with the aid of partially light permeable mirrors. However, individual discrete light sources, or a light-emitting integrated diode line, can also be utilized in the recording device 3. The recording beams 1 may be conveyed to the beam exit openings 2 either directly or over respective photoconductors and the beams can be suitably modulated utilizing light sources which can be switched on and off, or light modulators in the form of revolving crystals in combination with polarizing filters can be employed.

In the exemplary embodiment illustrated, a rotatable recording drum 5 is provided with a film 6 tensioned thereon which forms the recording medium. A flat-bed recording carrier likewise could be utilized in similar manner. The modulated recording beams 1, emerging through the respective beam exit openings 2 of the recording device 3 are reproduced on the film 6 by objective lens means 7, whereby a line of light points or dots 8 are exposed on a generatrix of the recording drum 5. By means of the rotation of the recording drum 5 in the direction of arrow 9, the light points 8 record successive recording lines which cooperably form a covering point 10. For example, if the recording beams 1 are switched on in chronological succession, a covering point having a graduated or stepped configuration will be formed. In the reproduction of a complete half tone picture, the recording device 3 undergoes an axial advance movement with respect to the recording drum 5 in the direction of arrow 4.

In order to remove the interferring striped structure in the covering point 10, an optical element 11 is disposed in the beam path to the objective lens means 7, which element refracts the recording beams in a direction opposite to that of the arrow 4. The optical element 11 takes up approximately half of the projection cross section of the total beam exit openings 2 and as a result of such optical element, the recording beams 1 are additionally deflected in such a manner that a laterally displaced auxiliary exposure 8' is reproduced on the film 6 at each light point 8. The light maximum of such auxiliary exposure thus, in each case, falls between two adjoining light points 8 and thus into the gaps of insufficient exposure. As a result, a homogenous density course results from the combined effect of the two exposure profiles extending across and along the covering point 10.

In the embodiment illustrated, the optical element is in the form of a wedge-shaped glass prism. However, advantageously it can also comprise an obliquely disposed glass plate, or a component of a weakly refracting lens. It will be appreciated that it is also possible to record arbitrary picture-like patterns instead of the covering points by means of the arrangement illustrated and described.

Figure 2:
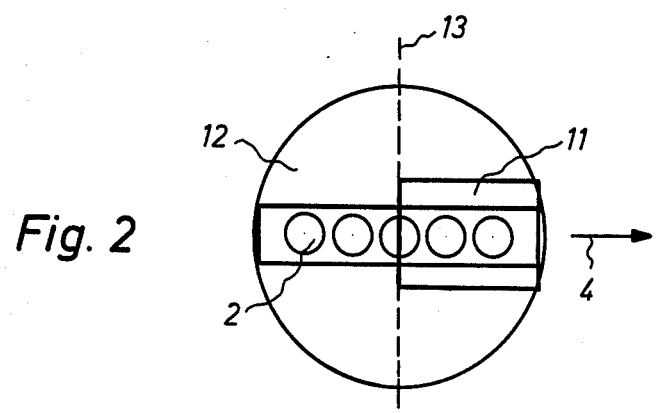
FIG. 2 is in effect a transverse section across the beam path illustrating the lens system.

FIG. 2 illustrates, in effect, a cross section through the beam path to the objective lens 7 with the optical element 11, occupying approximately half of the projection cross section 12 of all beam exit openings 2 of the recording device 3. The boundary line 13 of that portion of the projection cross section 12 subjected to the action of the optical element 11, advantageously extends perpendicularly to the extension direction of the exit openings 2 as clearly illustrated in FIG. 2.

It will be appreciated from the above disclosure that the present invention provides very effective results, employing a relatively very simple arrangement which eliminates the problems involved.

Having thus described our invention it will be obvious that although various minor modifications might be suggested by those versed in the art, it should be understood that we wish to embody within the scope of the patent granted hereon all such modifications as reasonably, and properly come within the scope of our contribution to the art.

We claim as our invention:

1. An arrangement for the recording of rastered half tone pictures, in which each raster point is formed on the recording medium by a plurality of parallel recording lines, extending in the recording direction, produced by a plurality of individually controlled light beams, discharged from beam emergence openings, of a recording device, aligned in a row extending transversely to the recording direction, and focused on the recording medium by objective lens means disposed on the beam path between said emergence openings and said recording medium, comprising an optical element interposed in the path of the light beams, said optical element being dimensioned to be operative on approximately half of the number of beams and oriented to refract the beams impacting it in the direction of alignment of said emergence openings, for effecting exposure of areas of the recording medium intermediate the areas impacted by the remaining unrefracted beams, thereby eliminating unexposed portions of the recording media between said parallel recording lines.

2. An arrangement according to claim 1, wherein said optical element is a glass plate disposed obliquely with respect to the transmission direction of the light beams.

3. An arrangement according to claim 1, wherein the optical element is a wedge-shaped glass prism.

4. An arrangement according to claim 1, wherein the optical element comprises lens means having a refractive action.

* * * * *